(12) United States Patent
Min et al.

(10) Patent No.: US 7,273,789 B2
(45) Date of Patent: Sep. 25, 2007

(54) METHOD OF FABRICATING HETEROJUNCTION BIPOLAR TRANSISTOR

(75) Inventors: Byoung Gue Min, Daejeon (KR); Jong Min Lee, Daejeon (KR); Seong Il Kim, Daejeon (KR); Chul Won Ju, Daejeon (KR); Kyung Ho Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 84 days.

(21) Appl. No.: 11/227,503

(22) Filed: Sep. 15, 2005

(65) Prior Publication Data

US 2006/0099767 A1 May 11, 2006

(30) Foreign Application Priority Data

Nov. 9, 2004 (KR) .................. 10-2004-0090673

(51) Int. Cl.
*H01L 21/331* (2006.01)
(52) U.S. Cl. .............. 438/312; 438/343; 438/364
(58) Field of Classification Search ................ 438/312, 438/320, 343, 364
See application file for complete search history.

(56) References Cited

U.S. PATENT DOCUMENTS 5,717,228 A * 2/1998 Matsuoka et al. .......... 257/197
5,994,194 A 11/1999 Lammert
6,541,346 B2 4/2003 Malik

FOREIGN PATENT DOCUMENTS

| JP | 08 139101 | 5/1996 |
| JP | 10 242161 | 9/1998 |
| KR | 10-2004 0044615 | 5/2004 |
| KR | 10-2004 0074401 | 8/2004 |

* cited by examiner

*Primary Examiner*—Hsien-Ming Lee
(74) *Attorney, Agent, or Firm*—Ladas & Parry LLP

(57) ABSTRACT

Provided is a method of fabricating a heterojunction bipolar transistor (HBT). The method includes: sequentially depositing a sub-collector layer, a collector layer, a base layer, an emitter layer, and an emitter capping layer on a substrate; forming an emitter electrode on the emitter capping layer; forming a mesa type emitter to expose the base layer by sequentially etching the emitter capping layer and the emitter layer using the emitter electrode as an etch mask in vertical and negative-sloped directions to the substrate, respectively; and forming a base electrode on the exposed base layer using the emitter electrode as a mask in self-alignment with the emitter electrode. In this method, a distance between the mesa type emitter and the base electrode can be minimized and reproducibly controlled. Also, a self-aligned device with an excellent high-frequency characteristic can be embodied.

14 Claims, 4 Drawing Sheets

METHOD OF FABRICATING HETEROJUNCTION BIPOLAR TRANSISTOR

CROSS-REFERENCE TO RELATED APPLICATION

This application claims priority to and the benefit of Korean Patent Application No. 2004-90673, filed Nov. 9, 2004, the disclosure of which is incorporated herein by reference in its entirety.

BACKGROUND

1. Field of the Invention

The present invention relates to a method of fabricating a heterojunction bipolar transistor (HBT) and, more specifically, to a method of fabricating an HBT in which a hexagonal emitter electrode is disposed in a certain crystalline direction of a substrate such that a mesa type emitter has a right-angled or negative-sloped etched surface, with the results that a distance between the mesa type emitter and a base electrode can be minimized and reproducibly controlled, and a self-aligned device with an excellent high-frequency characteristic can be embodied.

2. Discussion of Related Art

In general, a heterojunction bipolar transistor (HBT) using a compound semiconductor, such as GaAs or InP, has extensively been applied as an indispensable multifunctional device for communication because it has many advantages of a high-speed high-frequency characteristic, large current driving capability, linearity of signals, and uniform driving voltage.

When the HBT is fabricated, a distance between a mesa type emitter (or an emitter mesa) and a base electrode significantly affects the performance of the HBT. A too great distance between the mesa type emitter and the base electrode leads to an increase in parasitic base resistance, thus deteriorating the performance of the HBT.

Conventionally, an HBT using a compound semiconductor, such as GaAs, has been fabricated using a self-alignment technique in order to minimize a distance between the mesa type emitter and the base electrode.

Specifically, after an emitter electrode is formed, the mesa type emitter is etched using the emitter electrode as an etch mask. In this case, the mesa type emitter has a smaller size than that of the emitter electrode due to undercut.

Thus, the base electrode can be lifted off due to a shadow effect of the emitter electrode that protrudes outward from the mesa type emitter, and the mesa type emitter can be self-aligned with the base electrode.

Also, in the fabrication of an HBT using an InP emitter layer, an InGaAs base layer, and an InP substrate, the mesa type emitter is typically etched by a wet etching process.

This is because arsenide such as InGaAs or InAlAs, which forms an emitter capping layer or the base layer, and phosphide such as InP, which forms the emitter layer, are selectively etched by a wet etching process according to the type of etchant.

Specifically, a phosphoric acid-based etchant (e.g., a mixture of $H_3PO_4$, $H_2O_2$, and $H_2O$) etches arsenide but hardly etches phosphide, whereas an HCl-containing etchant (a mixture of HCl and $H_3PO_4$) etches phosphide but hardly etches arsenide. This selective wet etching process makes it easy to control the etch depth as compared to a dry etching process.

However, in the case of an InP-based HBT, the profile of an etched surface (i.e., whether the etched surface is positive-sloped or negative sloped) is determined depending on a crystalline direction of a substrate.

Because the etched surface has a positive slope in a certain crystalline direction, the InP-based HBT needs more excessive undercut for emitter-base self-alignment than other typical self-aligned devices, such as a GaAs-based self-aligned device.

For this reason, in the InP-based HBT, the distance between the mesa type emitter and the base electrode is increased, and there are difficulties in maintaining the distance therebetween constant. Further, as the distance between the mesa type emitter and the base electrode varies with a position in the circumference of an emitter electrode (i.e., with a crystalline direction), the properties of the HBT become unstable.

In conclusion, conventional methods cannot sufficiently control undercut and minimize the distance between the mesa type emitter and the base electrode.

SUMMARY OF THE INVENTION

The present invention is directed to a method of fabricating a heterojunction bipolar transistor (HBT), in which a distance between a mesa type emitter and a base electrode is minimized using not only appropriate etchants for a selective etching process but also the crystalline anisotropy. Thus, a self-aligned device can be obtained without any additional mask for forming the mesa type emitter, and the performance of the self-aligned device can be highly enhanced using stable and reproducible processes.

One aspect of the present invention is to provide a method of fabricating an HBT including: sequentially depositing a sub-collector layer, a collector layer, a base layer, an emitter layer, and an emitter capping layer on a substrate; forming an emitter electrode on the emitter capping layer; forming a mesa type emitter to expose the base layer by sequentially etching the emitter capping layer and the emitter layer using the emitter electrode as an etch mask in vertical and negative-sloped directions to the substrate, respectively; and forming a base electrode on the exposed base layer using the emitter electrode as a mask in self-alignment with the emitter electrode.

The emitter electrode may be formed to have a hexagonal shape.

The formation of the emitter electrode may include forming a photoresist having a negative slope using an image-reversal lithography process; depositing a metal layer; and lifting off the metal layer.

When the mesa type emitter is formed, the emitter electrode may be disposed in a certain crystalline direction of the substrate such that the mesa type emitter has negative-sloped or vertical sectional shapes.

The formation of the base electrode may include forming a photoresist pattern having a negative slope on the base layer using an image-reversal lithography process, wherein the photoresist pattern is formed in an emitter electrode region and a base electrode region, which is defined such that a base electrode is spaced apart from the emitter electrode by a predetermined distance and surrounded by the emitter electrode; depositing a metal thin layer on the entire top surface of the resultant structure such that the base electrode is formed on the base layer using the emitter electrode as a mask; and removing the photoresist pattern and the metal thin layer deposited on the photoresist pattern using a lift-off process.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIGS. 1A through 1E are cross sectional views and a perspective view illustrating a method of fabricating a heterojunction bipolar transistor (HBT) according to an exemplary embodiment of the present invention.

Figure 1A:
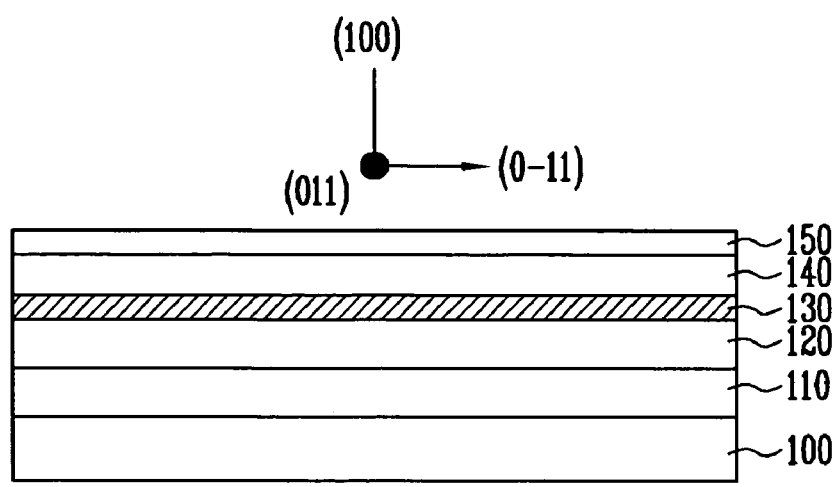
FIGS. 1A through 1E are cross sectional views and a perspective view illustrating a method of fabricating a heterojunction bipolar transistor (HBT) according to an exemplary embodiment of the present invention.

Referring to FIG. 1A, in order to fabricate the HBT, a sub-collector layer 110, a collector layer 120, a base layer 130, an emitter layer 140, and an emitter capping layer 150 are sequentially grown on a semi-insulating compound semiconductor substrate 100 using an epitaxial growth process.

Figure 1B:
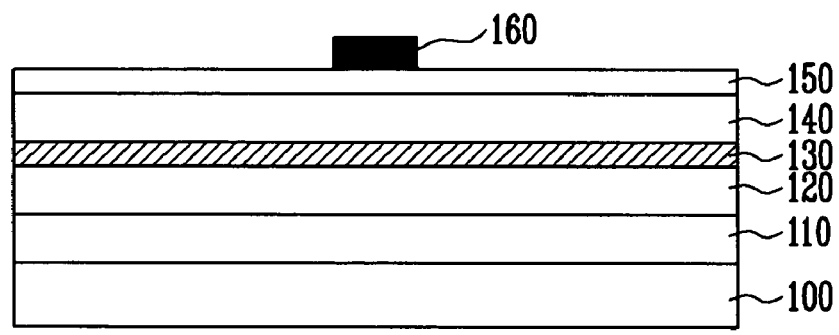

Referring to FIG. 1B, a negative-sloped photoresist is formed using an image-reversal lithography technique, and a metal layer is deposited and lifted off, so that an emitter electrode 160 is formed over the substrate 100. The emitter electrode 160 has, for example, a hexagonal shape when seen from a top view.

Figure 1C:
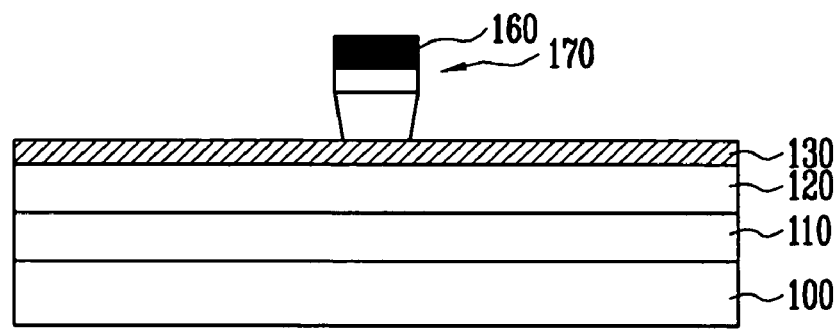

Referring to FIG. 1C, by using the emitter electrode 160 as an etch mask, the emitter capping layer 150, which is formed of an InGaAs-based material, is etched using an etchant formed of, for example, $H_3PO_4$, $H_2O_2$, and $H_2O$. Subsequently, the emitter layer 140, which is formed of InP, is etched using an etchant formed of, for example, HCl and $H_3PO_4$, thereby forming a mesa type emitter 170 to expose the base layer 130.

In this case, since a direction orthogonal to the bottom is parallel to the (011) direction of the InP substrate 100, an etched surface of the mesa type emitter 170 includes an etched surface of a right-angled layer to the substrate 100 (i.e., the emitter capping layer 150) or an etched surface of a negative-sloped layer (i.e., the emitter layer 140).

Figure 1D:
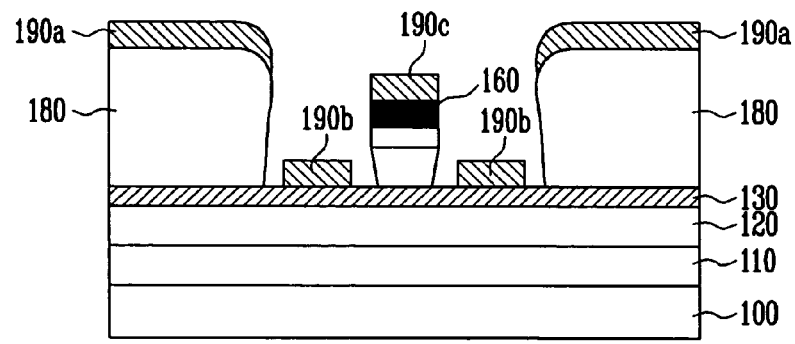

Referring to FIG. 1D, the photoresist is exposed and developed using, for example, an image-reversal lithography technique so that a photoresist pattern 180 having a negative slope is formed in a base electrode region and an emitter electrode region.

Thereafter, a metal layer for a base electrode is deposited on the entire surface of the substrate 100 using, for example, an electron-beam (e-beam) deposition process. Thus, a metal layer 190a is deposited on the photoresist pattern 180, a metal layer 190c is deposited on the emitter electrode 160, and a metal layer 190b (i.e., the base electrode) is deposited on the base layer 130.

Figure 1E:
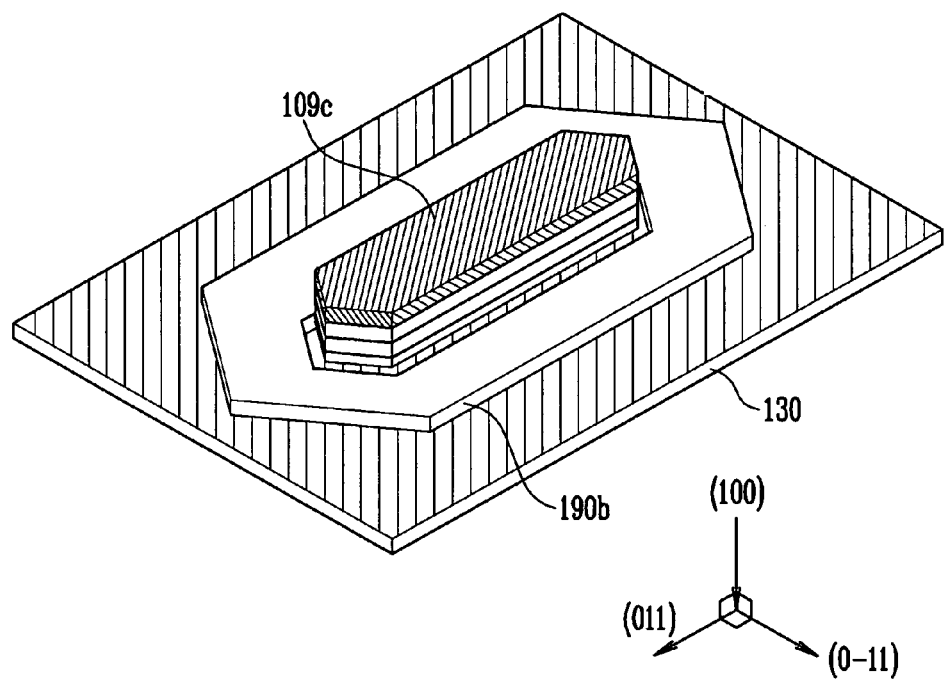

Referring to FIG. 1E, the photoresist pattern 180 and the metal layer 190a deposited thereon are removed using, for example, a lift-off process. The metal layer 190b (i.e., the base electrode) deposited on the base layer 130 is formed using the emitter electrode 160 as a mask and is not electrically connected to the metal layer 190c deposited on the emitter electrode 160 due to the negative-sloped etched surface of the mesa type emitter 170.

Figure 2A:
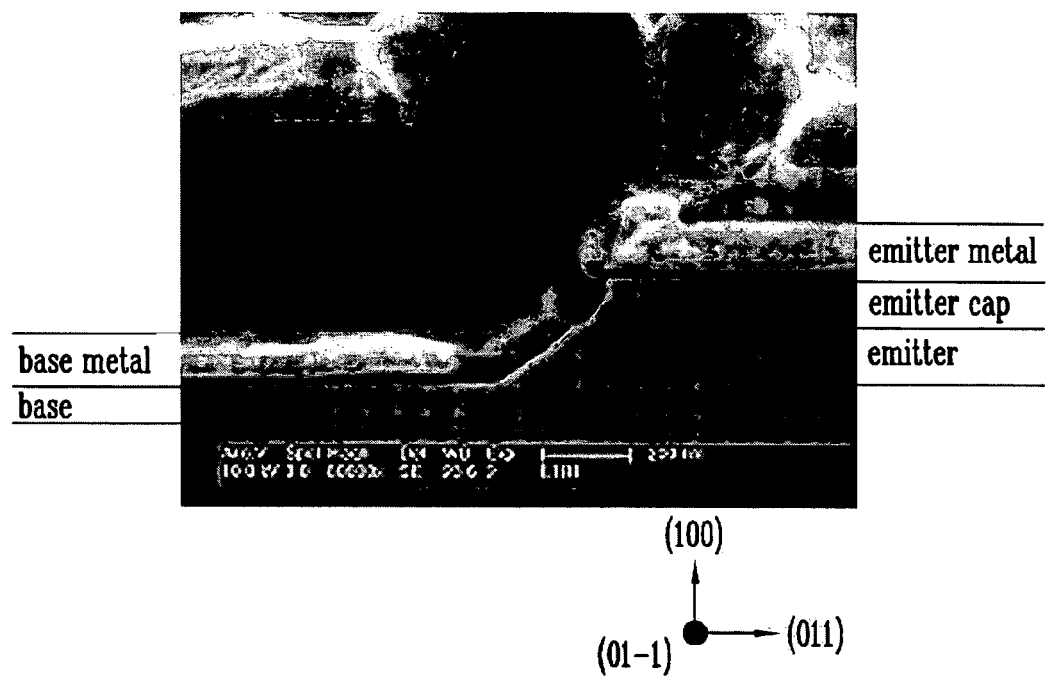
FIGS. 2A and 2B are scanning electron microscopy (SEM) pictures of an example of an HBT according to an exemplary embodiment of the present invention.
Figure 2B:
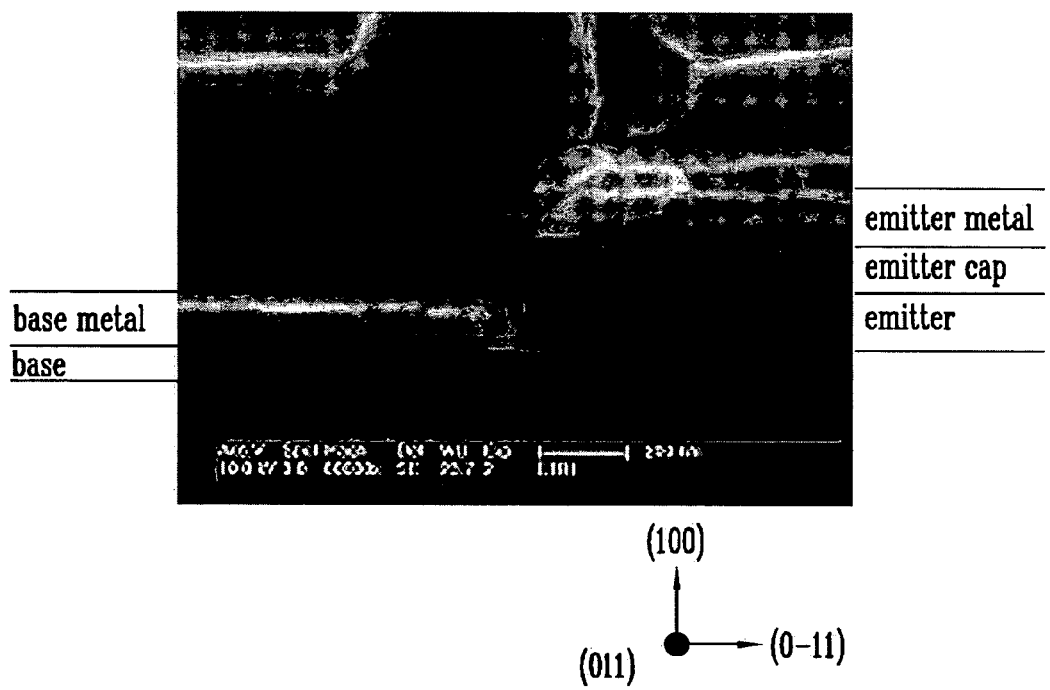

Meanwhile, referring to FIG. 2B, a distance between the mesa type emitter 170 and the metal layer 190b (i.e., the base electrode) deposited on the base layer 130 becomes a minimum of about 0.1 µm or less.

As a result, referring to FIG. 1E, which three-dimensionally shows an emitter-base self-aligned device, the emitter electrode 160 has a hexagonal shape. Since two long sides of the hexagonal shape are at a right angle to the (0-11) direction, etched surfaces of the mesa type emitter 170 corresponding to the long sides are right-angled or negative-sloped. Also, since four short sides of the hexagonal shape, which make an angle of 45° to the (0-11) direction, are at a right angle to the (001), (0-10), (00-1), and (010) directions, respectively, etched surfaces of the mesa type emitter 170 corresponding to the short sides have vertical sections.

In other words, the hexagonal emitter electrode 160 has no (011)-directional side with a positive-sloped etched surface. Thus, there is no likelihood of a short circuit between the emitter electrode 160 and the base electrode 190b or a leakage current in the emitter layer 140 and the base electrode 190b. Besides, over-etching for providing sufficient undercut is not required.

FIGS. 2A and 2B are scanning electron microscopy (SEM) pictures of an example of an HBT according to an exemplary embodiment of the present invention. In order to show the effect of the present invention, FIGS. 2A and 2B show cross sections of a typical InP/InGaAs HBT after an emitter capping layer formed of InGaAs (or InGaAlAs) and an emitter layer formed of InP are etched in a mesa type.

Referring to FIG. 2A, the (01-1) crystal direction of an InP epitaxy substrate is orthogonal to the drawing sheet. An etched surface of the emitter capping layer formed of InGaAs (or InGaAlAs) has a positive slope of about 45°, and an etched surface of the InP emitter layer has a gentler positive slope of about 60°.

Referring to FIG. 2B, the (011) direction of the InP epitaxy substrate is orthogonal to the drawing sheet. Unlike in FIG. 2A, an etched surface of the emitter capping layer includes very small undercut and is almost at a right angle to the InP epitaxy substrate, and an etched surface of the InP emitter is negative-sloped.

The result shown in FIG. 2B is obtained when arsenide is etched using an etchant comprised of, for example, $H_3PO_4$, $H_2O_2$, and $H_2O$ or when phosphide is etched using an etchant comprised of, for example, HCl and $H_3PO_4$. Meanwhile, an etched surface of the InP emitter, which makes an angle of 45° with each of the (011) and (01-1) directions and is at a right angle to the (010) direction, is at a right angle to the InP epitaxy substrate.

Figure 3:
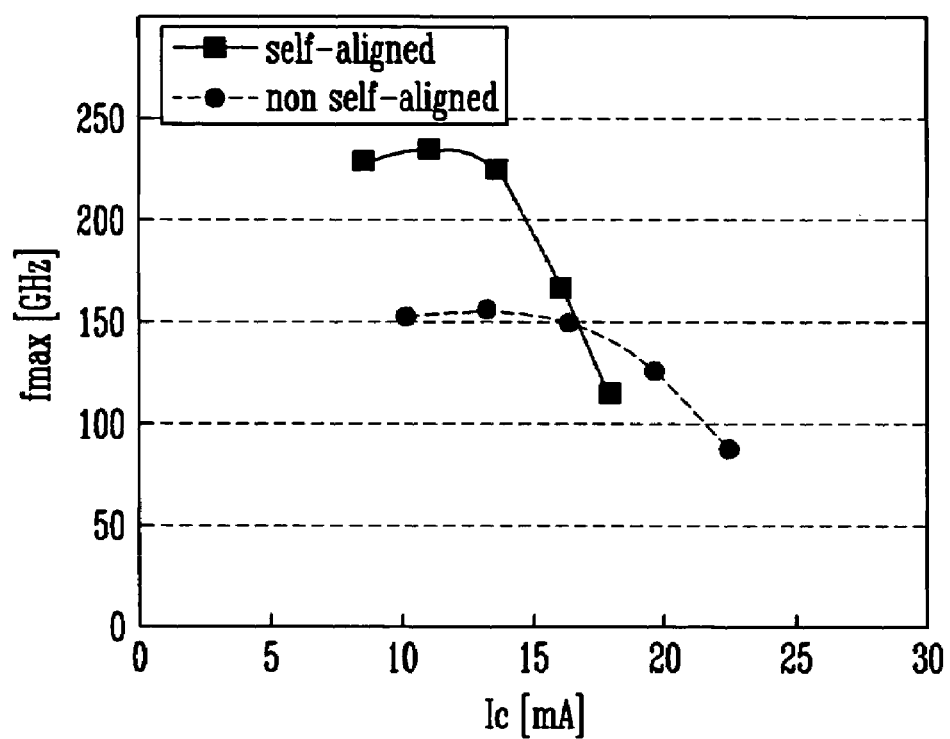
FIG. 3 is a graph showing the characteristics of an HBT according to an exemplary embodiment of the present invention.

FIG. 3 is a graph showing the characteristics of an HBT according to an exemplary embodiment of the present invention. FIG. 3 shows results of a comparison between the high-frequency characteristics of a self-aligned device according to the present invention and a non self-aligned device. The self-aligned device and the non self-aligned device are fabricated using the same InP/InGaAs HBT structured epitaxy substrate.

Referring to FIG. 3, a variation of maximum oscillation frequency (fmax) relative to collector current (Ic) is represented graphically, and an emitter-collector voltage is 1.5 V. The maximum oscillation frequencies of the self-aligned device according to the present invention and the non self-aligned device are 235 GHz and 167 GHz, respectively. From the result, it can be concluded that the self-aligned device according to the present invention is superior to the non self-aligned device.

As described above, the present invention facilitates the self-alignment of the base electrode 190b with the emitter electrode 160 and the mesa type emitter (or an emitter mesa) 170 during the fabrication of an HBT using a compound semiconductor, such as InP.

In other words, after the emitter electrode 160 is formed, the mesa type emitter 170 is formed using a wet etching process, and then the base electrode 190b is formed to be spaced apart from the mesa type emitter 170 by a certain distance by use of the crystalline anisotropy of etched surfaces.

In this case, the crystalline anisotropy is a characteristic that an etch rate varies according to the crystalline direction of a single crystalline structure, such as a semiconductor. In this respect, a certain crystalline surface or a surface that makes a certain angle with the crystalline surface becomes an etched surface.

In order to employ the crystalline anisotropy, the shape of the emitter electrode 160 should be disposed in a certain crystalline direction of the substrate 100. Above all, in an InGaAs/InP HBT using an InP substrate, a side of the emitter electrode 160, which is parallel to the (011) direction, should have the minimum length. Thus, a self-aligned device according to the present invention is much superior to a non self-aligned device in terms of a high-frequency characteristic.

As described above, according to the present invention, a hexagonal emitter electrode is disposed in a certain crystalline direction of a substrate so that a mesa type emitter has only right-angled or negative-sloped etched surfaces. As a result, the formation of excessive undercut caused by the etching of the mesa type emitter can be prevented, and also a distance between the mesa type emitter and a base electrode can be precisely controlled.

Further, owing to a reduction in base parasitic resistance, a self-aligned device according to the present invention is much superior to a non self-aligned device in terms of a high-frequency characteristic.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A method of fabricating a heterojunction bipolar transistor, comprising:
   sequentially depositing a sub-collector layer, a collector layer, a base layer, an emitter layer, and an emitter capping layer on a substrate;
   forming an emitter electrode on the emitter capping layer wherein forming the emitter electrode comprises:
      forming a photoresist having a negative slope using an image-reversal lithography process;
      depositing a metal layer; and
      lifting off the metal layer:
   forming a mesa type emitter to expose the base layer by sequentially etching the emitter capping layer and the emitter layer using the emitter electrode as an etch mask in vertical and negative-sloped directions to the substrate, respectively; and
   forming a base electrode on the exposed base layer using the emitter electrode as a mask in self-alignment with the emitter electrode.

2. The method according to claim 1, wherein forming the emitter electrode comprises forming the emitter electrode to have a hexagonal shape.

3. The method according to claim 1, wherein forming the mesa type emitter comprises disposing the emitter electrode in a crystalline direction of the substrate such that the mesa type emitter has negative-sloped or vertical sectional shapes.

4. The method according to claim 1, wherein forming the mesa type emitter comprises forming the mesa type emitter using an anisotropic etching process such that the mesa type emitter is spaced apart from the base electrode by a predetermined distance.

5. The method according to claim 1, wherein forming the mesa type emitter comprises etching the emitter capping layer and the emitter layer using a wet etching process.

6. The method according to claim 5, wherein the emitter capping layer is etched using an etchant comprised of H3PO4, H2O2, and H20, and the emitter layer is etched using an etchant comprised of HCl and H3PO4.

7. The method according to claim 1, wherein forming the base electrode comprises:
   forming a photoresist pattern having a negative slope on the base layer using an image-reversal lithography process, the photoresist pattern being formed in an emitter electrode region and a base electrode region, which is defined such that the base electrode is spaced apart from the emitter electrode by a predetermined distance and the emitter electrode is surrounded by the base electrode;
   depositing a metal layer on the entire surface of the resultant structure using a electron beam deposition method such that the base electrode is formed on the base layer using the emitter electrode as a mask; and
   removing the photoresist pattern and the metal layer deposited on the photoresist pattern using a lift-off process.

8. A method of fabricating a heterojunction bipolar transistor, comprising:
   sequentially depositing a sub-collector layer, a collector layer, a base layer, an emitter layer, and an emitter capping layer on a substrate;
   forming an emitter electrode on the emitter capping layer;
   forming a mesa type emitter to expose the base layer by sequentially etching the emitter capping layer and the emitter layer using the emitter electrode as an etch mask in vertical and negative-sloped directions to the substrate, respectively; and
   forming a base electrode on the exposed base layer using the emitter electrode as a mask in self-alignment with the emitter electrode, wherein fanning the base electrode comprises:
      forming a photoresist pattern having a negative slope art the base layer using an image-reversal lithography process, the photoresist pattern being formed in an emitter electrode region and a base electrode region, which is defined such that the base electrode is spaced apart from the emitter electrode by a predetermined distance and the emitter electrode is surrounded by the base electrode;

depositing a metal layer on the entire surface of the resultant structure using an electron beam deposition method such that the base electrode is formed on the base layer using the emitter electrode as a mask; and removing the photoresist pattern and the metal layer deposited on the photoresist pattern using a lift-off process.

9. The method according to claim 8, wherein forming the emitter electrode comprises forming the emitter electrode to have a hexagonal shape.

10. The method according to claim 8, wherein forming the emitter electrode comprises:

forming a photoresist having a negative slope using an image-reversal lithography process;

depositing a metal layer; and lifting off the metal layer.

11. The method according to claim 8, wherein forming the mesa type emitter comprises disposing the emitter electrode in a crystalline direction of the substrate such that the mesa type emitter has negative-sloped or vertical sectional shapes.

12. The method according to claim 8, wherein forming the mesa type emitter comprises forming the mesa type emitter using an anisotropic etching process such That the mesa type emitter is spaced apart from the base electrode by a predetermined distance.

13. The method according to claim 8, wherein forming the mesa type emitter comprises etching the emitter capping layer and the emitter layer using a wet etching process.

14. The method according to claim 13, wherein the emitter capping layer is etched using an etchant comprised of $N_3PO_4$, $H_2O_2$, and $H_2O$, and the emitter layer is etched using an etchant comprised of HCl and $H_3PO_4$.

* * * * *